(12) United States Patent
Klosner

(10) Patent No.: US 6,238,852 B1
(45) Date of Patent: May 29, 2001

(54) MASKLESS LITHOGRAPHY SYSTEM AND METHOD WITH DOUBLED THROUGHPUT

(75) Inventor: Marc A. Klosner, White Plains, NY (US)

(73) Assignee: Anvik Corporation, Hawthorne, NY (US)

(*) Notice: Subject to any disclaimer, the term of this patent is extended or adjusted under 35 U.S.C. 154(b) by 0 days.

(21) Appl. No.: 09/225,385

(22) Filed: Jan. 4, 1999

(51) Int. Cl.[7] ................................. G03F 7/00; G03F 7/20

(52) U.S. Cl. ........................ 430/396; 430/322; 355/46; 355/53; 355/77

(58) Field of Search ........................... 430/322, 396; 355/46, 53, 77

(56) References Cited

U.S. PATENT DOCUMENTS

| | | | |
|---|---|---|---|
| 5,523,193 | * 6/1996 | Nelson | 430/311 |
| 5,691,541 | * 11/1997 | Ceglio et al. | 250/492.1 |
| 5,870,176 | * 2/1999 | Sweatt et al. | 355/53 |

FOREIGN PATENT DOCUMENTS

| | | | |
|---|---|---|---|
| 62-034460 | * 2/1987 | (JP) . | |
| 98/04950 | * 2/1998 | (WO) . | |

* cited by examiner

Primary Examiner—John A. McPherson
(74) Attorney, Agent, or Firm—Carl C. Kling

(57) ABSTRACT

A maskless lithography system that provides large-area, seamless patterning using a reflective spatial light modulator such as a Deformable Micromirror Device (DMD) directly addressed by a control system so as to provide a first pattern, via a first projection subsystem, on a first photoresist-coated substrate panel, while simultaneously providing a duplicate pattern, which is a negative of the pattern on the first substrate panel, via a second projection subsystem, onto a second photosensitive substrate panel, thus using the normally-rejected non-pattern "off" pixel radiation reflected by the "off" pixel micromirrors of the DMD, to pattern a second substrate panel. Since the "off" pixel reflections create a pattern which is complementary to the "on" pixel pattern, using a complementary photoresist coating on the second substrate panel provides for a duplicate pattern, as is usually desired. Since both the "on" and "off" reflections are used from each pixel position, using the same selection, the result is the doubling of throughput.

5 Claims, 3 Drawing Sheets c-on image on image

MASKLESS LITHOGRAPHY SYSTEM AND METHOD WITH DOUBLED THROUGHPUT

CROSS-REFERENCE TO RELATED APPLICATIONS

None

STATEMENT REGARDING FEDERALLY SPONSORED RESEARCH OR DEVELOPMENT

Not Applicable

REFERENCE TO MICROFICHE APPENDIX

None

BACKGROUND OF THE INVENTION

1. Field of the Invention

This invention relates to a maskless lithography system that provides large-area, seamless patterning using a reflective spatial light modulator such as a Digital Micromirror Device (DMD), which consists of an array of micromirrors, each being settable to an "on" reflective angle as directly addressed by a control system, so as to reflect a pattern via a projection subassembly onto a photosensitive panel of a substrate;

and more particularly relates to a throughput doubling configuration which, simultaneously with patterning onto a first substrate panel from the DMD array of "on" pixels, provides a duplicate pattern, which is the complement of the pixel pattern on the first panel, of "off" pixels, via a second projection subassembly onto a photosensitive panel of a second substrate, thus using the normally-rejected non-pattern "off" pixel radiation reflections of the DMD, simultaneously, to provide a second pattern on the second substrate panel.

2. Description of Related Art

Importance of Maskless Lithography Technology

High-throughput lithography systems are critical elements in the commercial fabrication of microelectronic components. They are used for high-volume production of small-area packages such as integrated circuits as well as large-area patterns such as printed circuit boards and flat-panel displays. High-throughput is important because the amount of time required to manufacture a microelectronic device has a significant effect on its cost in the consumer market. Optical lithography is the most widely used technology used for high-volume production because it can achieve high throughput via the parallel nature of its pattern generation, in which a large number of features are simultaneously printed onto a substrate during a single exposure This parallel processing using optical lithography is achieved by illuminating a mask in order to transfer its features onto the substrate. Since the features of a printed circuit are created by using a mask comprising a replica of the circuit's features, the complexity and size of a circuit directly influence the complexity and size of the corresponding mask which must be used to print it. However, regardless of the size and complexity of any circuit pattern, once the appropriate mask is on hand, optical lithography can precisely and efficiently generate that circuit.

Even with the substantial benefits of parallel processing, there exists a variety of factors which can significantly reduce the speed and efficiency at which optical lithography can proceed. For example, the intensity of the illumination and the sensitivity of the resist largely determine how quickly a single exposure can take place; the exposure speed can be improved by increasing the illumination intensity and/or the resist sensitivity. For circuits (such as those consisting of many layers of features) requiring many individual exposures, the switching of masks between exposures can represent a significant amount of overhead time. In order to print a new layer, a mask must be placed in position and accurately aligned before an exposure can take place. This positioning of the mask reduces the throughput. Additionally, a microelectronic fabrication facility must have an in-house stock of masks in order to generate the numerous circuits which it supplies to the consumer market. Purchasing and maintaining these masks results in large overhead costs.

Other issues associated with the use of a mask in optical lithography can also lead to lower productivity. For example, when developing a prototype circuit there is generally a need to obtain masks rapidly so that the prototype can be quickly manufactured and tested. However, since masks are typically manufactured by outside vendors with specialized equipment, it could take many weeks to procure a prototype mask, leading to delays in product development. Additionally, for prototype work the mask is often used only temporarily and then must be discarded when the prototype is refined, leading to large overhead expenses. These expenses can become quite significant for prototype circuits requiring multiple masks.

Another notable property of the mask is that its cost goes up with its size. Thus a mask used to print micron-sized features for flat panel displays—which are on the order of 1 ft.$^2$—could be significantly more expensive than a mask used to print similar-sized features over a much smaller area. Prototype development requiring the use of numerous large-area masks for each prototype generation can be enormously expensive.

The use of a mask thus enables lithography to achieve high volume throughput with parallel processing, but it can represent a significant burden. The use of a mask affects both the manufacturing process (with the overhead time required to switch masks and the cost of maintaining an in-house stock of masks) and the prototype development process (with the long mask-acquisition time and the expense of constructing and discarding numerous masks for prototype development). The use of a mask also affects the printing of large-area circuits, which require large-area masks. It would be of great benefit if the parallel processing power of a mask were maintained, while eliminating the need to switch masks during circuit production, reducing overhead manufacturing time. Additionally, overhead manufacturing costs could be reduced if it were not necessary to maintain a stock of production masks. Prototype development could proceed rapidly and economically if masks were eliminated, while maintaining the benefits of parallel exposure. Large-area circuit patterns could be printed more economically if large-area masks were not needed to achieve high-throughput. Thus, a technology which provides parallel exposure without the use of masks could significantly improve the productivity of microelectronic fabrication.

CURRENT LITHOGRAPHY TECHNOLOGIES

Currently available exposure systems can be classified into four general categories:

(a) contact and proximity printing systems, (b) various types of projection systems (conventional, step-and-repeat, and scanning), (c) focused-beam direct-writing systems, and (d) holographic imaging systems.

Each of these is briefly described.

Contact and Proximity Printing Systems

A contact printer consists of a fixture to align and hold the substrate in hard contact with the mask, which is then illuminated with high-intensity light to transfer the mask image to the substrate. A proximity system maintains a uniform gap between the mask and the substrate. Most contact printers use one or two mercury arc lamps, with powers in the range 2–8 kW. The radiation used for exposure is in the UV region from ~250 nm to ~430 nm, the rest of the light in the visible and the infrared being filtered away to minimize heating. The useful UV power represents less than 1% of the total wattage, indicating the extremely poor utilization efficiency of such lamp sources. A major limitation of contact printing is generation of defects on the substrate due to repeated contacting of the resist-coated surface, which results in lower yields. Frequent mask-substrate contact also degrades the mask life, which leads to higher overall costs. These problems are somewhat less severe in proximity printing, but feature size variation becomes a limitation. The resolution R in a proximity system using radiation of wavelength $\lambda$ depends on the mask-substrate gap d, as given by $R=(\lambda d/2)^{1/2}$, and therefore any nonuniformity in the gap d results in feature size variation. This limitation becomes more severe for larger panels as it becomes more difficult to maintain a uniform gap d between the mask and the substrate. It should be emphasized that since contact and proximity tools use masks to generate circuit patterns, they are both subject to the limitations noted in the previous section.

Various Types of Projection Systems

A variety of projection imaging systems are used in fabrication of microelectronic modules. Single-field, or conventional, projection tools are those in which the image field of the lens is sufficient to accommodate the entire substrate. Typically, a projection lens with a 1:1 magnification is used. For different design resolutions, the maximum image field size of the projection lens is different: whereas a 1 mil resolution can be obtained over a 4 inch square field, the imageable area for 1 micron resolution must be limited to a field diameter no larger than 2–3 cm. Thus, conventional projection printing systems are limited by the fundamental trade-off between the desired resolution and the largest substrate they can image.

In a step-and-repeat type of projection system, the total substrate area to be patterned is broken up into several segments, which segments are then imaged one at a time by stepping the substrate under the lens from one segment to the next. Due to the increased overhead time required for the stepping, settling and aligning steps for each segment, step-and-repeat projection systems deliver low throughputs. Most step-and-repeat systems use reduction imaging, typically with a 2:1, 5:1 or 10:1 ratio. Generally, systems with larger reduction ratios provide higher resolution, but also lower throughput. Step-and-repeat systems also have a performance shortcoming due to stitching errors between adjacent exposure segments. When a step-and-repeat systems is used for semiconductor chip lithography, the individual chip sites are separated by areas ('streets') through which the chips are diced. Since these streets contain no patterns, there is no requirement to precisely stitch adjacent segments together. However, in a large panel, as for a circuit board or a display, the entire substrate is often one pattern; there are no streets between segments. The segments, therefore, must be butted next to each other with great precision. Poor lithography due to stitching errors is one of the most significant yield detractors in the production of large-area products Recognizing the throughput limitations of step-and-repeat systems, many types of scanning projection tools have been developed over the last two decades. The most well known of these use a reflective ring-field imaging system. Exposures are made by scanning the mask (and the substrate) across an illumination beam in the shape of an annulus, which is necessitated by the geometry of the zone of good image correction. The scanning ring-field imaging concept requires primary imaging mirrors that are approximately three times the size of the substrate. As a result, such scanners, although capable of good resolution, are extremely expensive and incapable of handling most large panel sizes. Their throughputs are also low. Another class of scanning systems use a modified Dyson-type imaging system employing a large beamsplitter, a reduction ratio of 4:1, and separate mask and substrate stages traveling at velocities in the same ratio. These systems, while capable of resolution down to 0.25 $\mu$m, have an individual chip-field-size limitation of ~7 cm$^2$, and have prohibitively high system costs—approaching $10 million. Although masks used with projection lithography systems are significantly less vulnerable to damage than masks used in contact and proximity printers, the use of a mask in this printing technique still imposes limitations on the efficiency of production, for all of the reasons noted in the previous section.

Focused-beam Direct-writing System

A focused-beam direct-writing system uses a laser in a raster scanning fashion to expose all the pixels, one at a time, on the substrate. To be compatible with the spectral sensitivity of common photoresists, typically an argon-ion laser operating at one or more of its UV or blue wavelengths is employed. The laser beam is focused on the resist-coated substrate to the desired spot size. The focused spot is moved across the substrate in one dimension with a motor-driven scanning mirror. In conjunction, the stage holding the substrate is translated in the orthogonal dimension with a high-precision stepping motor. Simultaneously, the laser beam is modulated (typically, acousto-optically) to be either directed to the desired location on the substrate or deflected away. Thus, by driving the modulator and the two motors with appropriately processed pattern data, the entire substrate can be directly patterned. Of the many focused-beam direct-write systems currently available, the offered resolution varies from several microns for board patterning to under a micron for systems designed for mask-making applications for IC lithography. Since transfer of the pattern information by such tools takes place in a slow, bit-by-bit serial mode, typical substrate exposure times can range from 2 minutes to several hours per sq. ft., depending upon the resolution and the complexity of the pattern data. Although direct write systems do not require the use of masks—and are therefore not subject to many of the effects which limit mask-based technologies—the serial nature of their pattern generation renders direct-write systems significantly lower in throughput compared to contact, proximity, and projection printers.

Holographic Imaging Systems

Holographic imaging systems utilize a mask which is a hologram of the pattern to be imaged, such that when "played back," it projects the original pattern onto the substrate. The mask is generated by encoding the diffraction pattern from a standard mask in a volume hologram. Generally, for all but the simplest patterns, fabrication of the holographic mask requires numerous processing steps. In a holographic lithography system, the burden of imaging is placed entirely on the mask. Holographic imaging systems suffer from poor diffraction efficiency and are applicable, at best, for imaging of very periodic patterns of not very high resolution. If the pattern is not periodic, the imaging resolution degrades. Holographic masks are also considerably more expensive to generate, which is made further prohibitive when masks for many different layers are required for the substrate.

RELATED TECHNOLOGIES

There are two related technologies being deployed and patented by Anvik Corporation, the assignee of this invention. These technologies, seamless scanning technology, and seamless, maskless lithography technology, have solved stitching problems and quality problems in projection lithography for patterning of large area of substrates, but the need continues to improve production throughputs and production costs.

Seamless scanning technology

Seamless scanning technology, which achieves high-resolution, large-area, high-throughput capabilities has been described by K. Jain in previous patents, including: U.S. Pat. No. 4,924,257, Scan and repeat high-resolution lithography system, issued May 8, 1990; U.S. Pat. No. 5,285,236, Large-area, high-throughput, high-resolution projection imaging system, issued Feb. 8, 1994; and U.S. Pat. No. 5,652,645, High-throughput, high-resolution, projection patterning system, issued Jul. 29, 1997. In these patents, the inventor described exposure systems that can pattern large substrates by an efficient seamless scanning technique. The illumination system is designed to produce a hexagonal exposure region. Seamless joining of scans is achieved by partial overlap between adjacent scans, which produces a uniform exposure of the entire panel due to integration of complementary intensity profiles. The systems described in these prior patents are attractive for patterning substrates which can be rigid or flexible, and may be in the form of discrete panels or as a continuous sheet-roll fed from one roller and taken up by another roller after exposure.

Seamless, Maskless Lithography Technology

Anvik Corporation has also filed patent applications for seamless, maskless lithography systems using a spatial light modulator. There are transmissive spatial light modulators, including liquid crystal devices, which are not of interest in this invention. There are also reflective spatial light modulators, most significant of which is the Digital Micromirror Device (DMD). The Digital Micromirror Device (DMD) is an opto-mechanical system which that operates in the reflective mode. The DMD consists of an array of hinged micromirrors, with each of the micromirrors capable of tilting in only two precisely controlled orientations. When a micromirror tilts in one orientation, it reflects the incident illumination through an optical imaging system; such a micromirror element is therefore referred toas 'on'. A micromirror which tilts in the other orientation reflects the incident illumination such that it does not pass through the optical system; such a micromirror is referred to as 'off.' Thus, the light reflected from the 'off' pixels is rejected and wasted. The DMD, consisting of an array of micromirrors each of which may be independently turned 'on' or 'off', can be configured to form any desired pattern of 'on' elements, representing geometrical features of a printed circuit. These 'on' features, imaged by the optical system onto a substrate, therefore are analogous to the mask features of conventional lithography. Thus in this maskless system, the DMD replaces the mask of the conventional lithography systems.

BRIEF SUMMARY OF THE INVENTION

This invention is a maskless lithography system using a digital micromirror device (DMD), in which the illumination reflected by the 'on' pixels as well as the illumination reflected by the 'off' pixels are collected separately by two optical imaging systems, forming two complementary images on two separate substrate panels, one coated with positive photoresist, the other coated with negative photoresist. Because in this invention the illumination reflected from pixels situated in both orientations is collected and separately imaged, the pixels are hereafter referred to as 'on' and 'complementary-on' ('c-on' for short).

The 'on' and 'c-on' images are complementary to each other in the following manner the 'on' image consists of a pattern of light features in a dark background;

the 'c-on' image also consists of a pattern of light features in a dark background, and it is identical to the 'on' image except that the light features in the 'c-on' image have exactly the same configuration as the dark background in the 'on' image.

In order to form these images, the substrate panels are held rigidly on a scanning stage whereas the DMD remains in a fixed (i.e., non-moving) position. An illumination source, coupled to a subsystem which homogenizes and configures the illumination beam, also remains fixed, and illuminates the DMD with a homogenized hexagonal beam, causing complementary patterns (the 'on' and 'c-on' patterns) of light to be reflected from the DMD. The 'on' and 'c-on' reflected-illuminations are each directed to separate optical subsystems, imaging the 'on' and 'c-on' patterns onto separate substrate panels. As the stage is scanned, the DMD pattern display is updated, thereby simultaneously 'scanning' the pattern across the DMD at the same rate at which the stage is moving, therewith precisely mimicking a scanning mask. Suitable overlap between the intensity profiles produced by the hexagonal illumination configuration ensures seamless joining of the scans on each of the 'on' and 'c-on' substrate panels.

The object of the invention is to double the throughput of a DMD-addressed microlithography system by using illumination reflected from both the 'on' and 'c-on' pixels, and directing the 'on' reflection to a first substrate panel and directing the 'c-on' reflection to a second substrate panel simultaneously, providing a pattern image to each of two substrate panels.

A feature of the invention is its use of both the "on" reflection and the "complementary on" reflection, which was simply "off," and wasted, in the prior art, directing these complementary reflections to separate photoresist-coated substrate panels which may use complementary photoresists, (i.e., one positive, the other negative) so that the same pattern may be formed on each of two substrate panels.

The advantage of the invention is that it doubles throughput.

Other objects, features and advantages of the invention will be apparent from the description of a preferred embodiment in the detailed description of the invention and from the following drawing views.

DETAILED DESCRIPTION OF THE INVENTION

Figure 1:
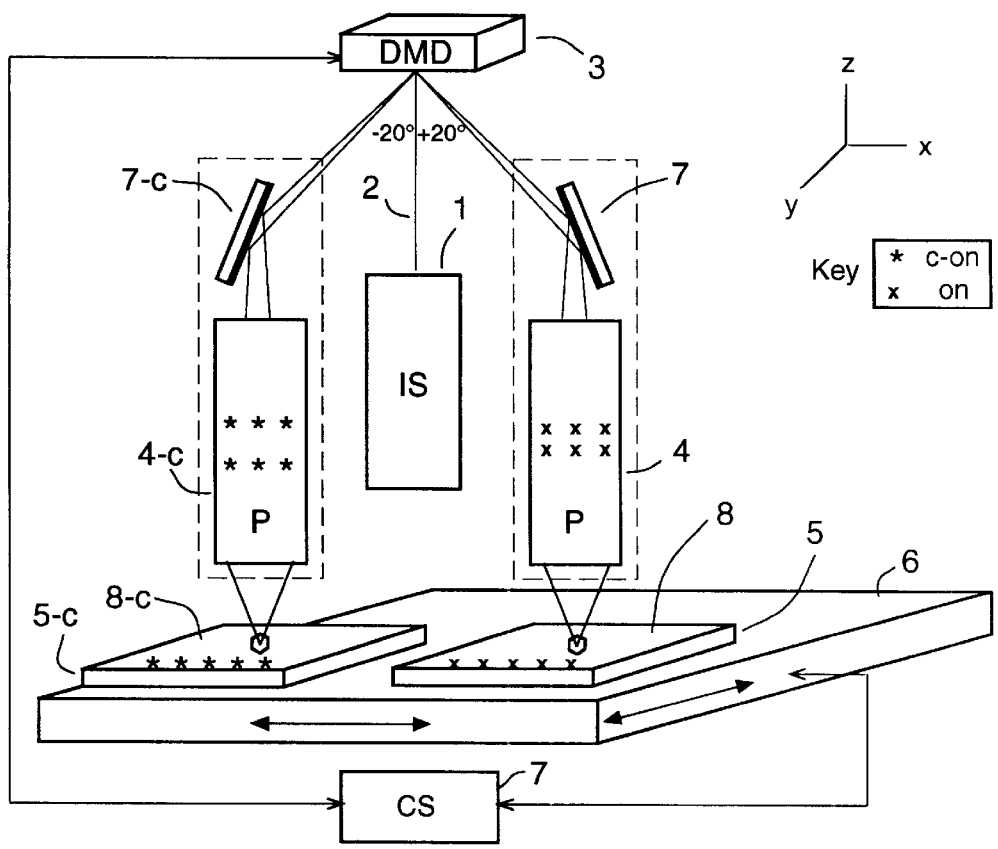
FIG. 1 is a schematic illustration of the dual-path lithography system of the invention.
Figure 2:
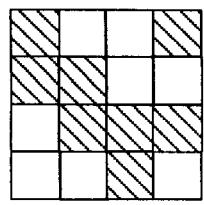
FIG. 2 is a simplified showing of a pattern of 'on' pixels from DMD settings.
Figure 3:
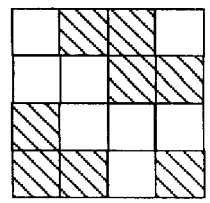
FIG. 3 is a simplified showing of a pattern of 'c-on' pixels from the DMD setting of FIG. 2.

FIG. 1 is a schematic illustration of the maskless lithography system with doubled throughput, for forming two separate pattern images simultaneously. Radiation source 1, preferably a laser, provides a pulsed radiation beam 2, of area encompassing a group of pixels. This multi-pixel-size radiation beam 2 is incident on DMD 3, and is selectively reflected, according to the desired pattern of 'on' and 'off' pixels, in two complementary patterns along two different optical paths. The two sub-beams, which are complementary pixel by pixel, are subsequently transmitted through respective optical projection subsystems 4 and 4-c for patterning of the respective substrate panels 5 and 5-c. The substrate panels 5 and 5-c are affixed to the scanning platform 6, which provides all scanning motions for the system. The two complementary pixel pattern illuminations reflected by DMD 3 (which remains stationary) are imaged by two identical projection lens subsystems, one subsystem imaging the 'on' illumination, the other subsystem imaging the 'c-on' illumination. This is illustrated schematically in FIG. 2 and FIG. 3, respectively, for a 4 pixel×4 pixel DMD array for simplified sample feature patterns of light features in a dark background. For the purpose of this discussion, suppose the 'on' and 'c-on' pixels of the DMD 3 assume orientations of +10° and −10° of tilt (as in Texas Instruments' DMD) with respect to a reference plane. The illumination is incident upon the DMD at an angle of 90° with respect to the reference plane. Thus the 'on' pixels reflect illumination at an angle of 20° with respect to the reference plane, and the c-on pixels reflect illumination at an angle of −20° with respect to the reference plane. Fold mirrors 4-1 and 4-1c redirect the on and c-on reflected-illuminations, causing them to propagate along the optical axes of their respective projection subsystems 4 and 4-c. The DMD 3 is situated symmetrically between the two projection subsystems 4 and 4-c, such that it resides in the image plane of both subsystems.

The substrate may be either a single panel or two individual panels 5 and 5-c as shown, one recording the 'on' image and the other recording the 'c-on' image. Additionally, the two substrate panels 5 and 5-c preferably have complementary photosensitive coatings (i.e., one positive and one negative) of photoresists 8 and 8-c, so that—since the 'on' and 'c-on' illumination patterns are complementary—the resultant printed features on each of substrate panels 5 and 5-c are identical. Control subsystem CS 7 controls the DMD pixel settings and controls the scanning motions of stage 6.

NOTE: It is conceivable that the desired result might be to produce positive and negative patterns simultaneously, perhaps for some masking or mask-checking considerations. This can be simply done by using two substrate panels, both coated with the same photoresist, either positive or negative, or a single panel coated with a photoresist.

Before proceeding further, the technology of the seamless scanning exposure mechanism, as applied to DMD-based maskless lithography, will be reviewed. Note that the above discussion assumes that the 'on' and 'off' micromirror elements of the DMD are oriented symmetrically at +10° and −10° about the radiation beam 2. Use of a different type of DMD may require adjustment of the optics so as to accept the on and c-on reflections at angles other than +10° and −10°.

A description of the prior art seamless scanning technology as well as its application to the prior art maskless lithography should aid in understanding the significance of this invention.

Figure 4:
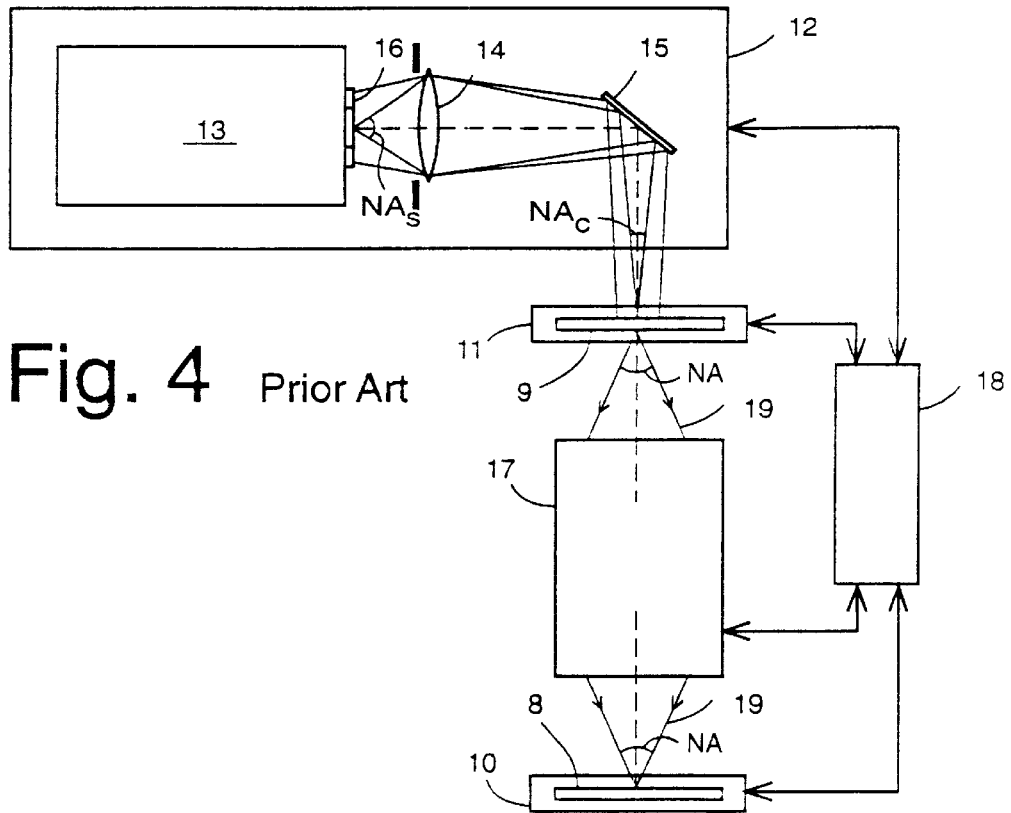
FIG. 4 is a prior art showing of a scan and repeat patterning system using a mask.

FIG. 4 (prior art) schematically illustrates a seamless scan-and-repeat patterning system when used with a mask 9. The substrate 8 and the mask 9 are each held rigidly in a substrate stage 10 and a mask stage 11, respectively. Both the substrate stage 10 and the mask stage 11 move in synchronism with fine precision. The illumination system 12 consists of a source system 13, a relay lens 14, and beam steering optics 15. The source system 13 is such that its effective emission plane 16 is in the shape of a regular hexagon. The relay lens 14 collects radiation into a certain numerical aperture, $NA_s$, from the effective emission plane and directs it with a certain magnification and numerical aperture, $NA_c$, on the mask 9. A projection lens assembly 17, which may consist of several individual lens elements and prisms or mirrors, forms a precise image of the high-resolution pattern contained within the illuminated hexagonal region on the mask 9 onto the substrate 8. The projection lens 17 has a numerical aperture NA determined by the resolution requirements of the patterning system and is designed for as large a circular image field as possible. The substrate stage 10 scans the substrate 8 across its hexagonal exposure region so as to traverse the length of the substrate in the direction of the scan. Simultaneously, the mask stage 11 scans the mask 9 across its hexagonal illuminated region. After completion of a scan, both stages 10 and 11 move in a direction orthogonal to the scan direction. Following such a lateral movement, a new scan is generated by precise movements of the substrate stage 10 and mask stage 11 in the same manner as before. The effective scan width and the illumination source system 12 are designed with such characteristics that in combination, they produce a transition, from one scan to the next, that is "seamless" and free from non-uniformities in intensity. The above exposure process, thus termed a "scan-and-repeat" mechanism, is repeated until the entire substrate is exposed. The projection assembly 17 also incorporates an automatic focus system. A control system 18 is functionally coupled to the illumination system 12, the mask stage 10 and substrate stage 11, and the projection lens assembly 17. Control system 18 ensures that the mask stage 10 and substrate stage 11 are focused and aligned appropriately with respect to the projection lens assembly 17 at all times, that the mask stage 10 and substrate stage 11 perform the scan and repeat movements with the desired synchronism, and that the illumination system 12 maintains the desired illumination characteristics throughout the exposure of the entire substrate 8.

Seamless Scanning Technology

Figure 5:
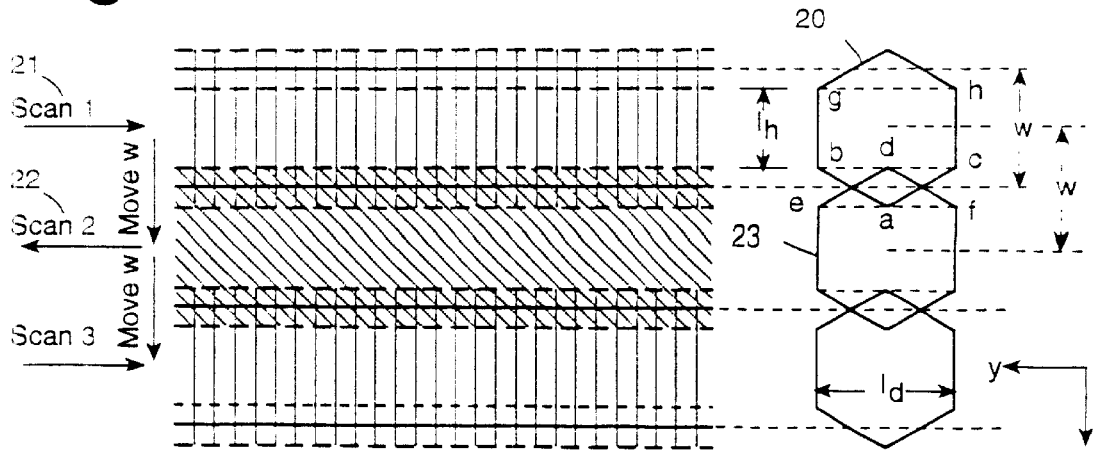
FIG. 5 is a prior art showing of seamless scanning achieved using the apparatus of FIG. 4.

FIG. 5 (prior art) illustrates how seamless scanning is achieved by the apparatus of FIG. 4. The hexagon 20 represents the potentially illuminated portion of the substrate 8 at any given moment. (Likewise, hexagonal illumination appears on the mask, which is seamlessly scanned in a similar fashion, because the mask moves in synchronization with the substrate.) The substrate is scanned across this illumination region from right to left. It is important to note that the illumination beam itself (19 in FIG. 2) is stationary, as is the projection lens assembly. Thus, for pictorial illustration, the movement of the substrate 8 across the beam is depicted as the scanning, from left to right, of the hexagonal illumination region across a stationary substrate 8. This movement is depicted by Scan 1, reference 21 in FIG. 5. Because one side of the hexagon c-h is orthogonal to the scan direction, the region of the substrate that is illuminated by triangular region a-b-c receives a smaller exposure dose than does the part of the substrate that is illuminated by the rectangular portion b-g-h-c of the hexagon. However, if the subsequent scan, Scan 2, (22 in FIG. 5) is generated at the correct distance from Scan 1 (21 in FIG. 5), then the triangular area a-b-c in hexagon 20 is re-swept in Scan 2 (22 in FIG. 5) by triangular area d-e-f in hexagon 23. The correct distance between scans is achieved when, after completion of a scan, both stages move in a direction orthogonal to the scan direction by an amount termed the "effective scan width." This distance is determined as effective scan width=w=1.5 $l_h$, where $l_h$ is the length of each side of the hexagon. The region in FIG. 5 where triangular areas a-b-c and d-e-f overlap receives an integrated exposure dose that is the same as the dose received by the non-overlapping regions. Thus, the transition from Scan 1 to Scan 2 (and therefore across the substrate) is seamless in exposure dose uniformity, because the overlapping doses provided by hexagons 20 and 23 taper in opposite directions, from maximum to zero at outermost points a and d, respectively.

Maskless Seamless Scanning Using a DMD

Figure 6:
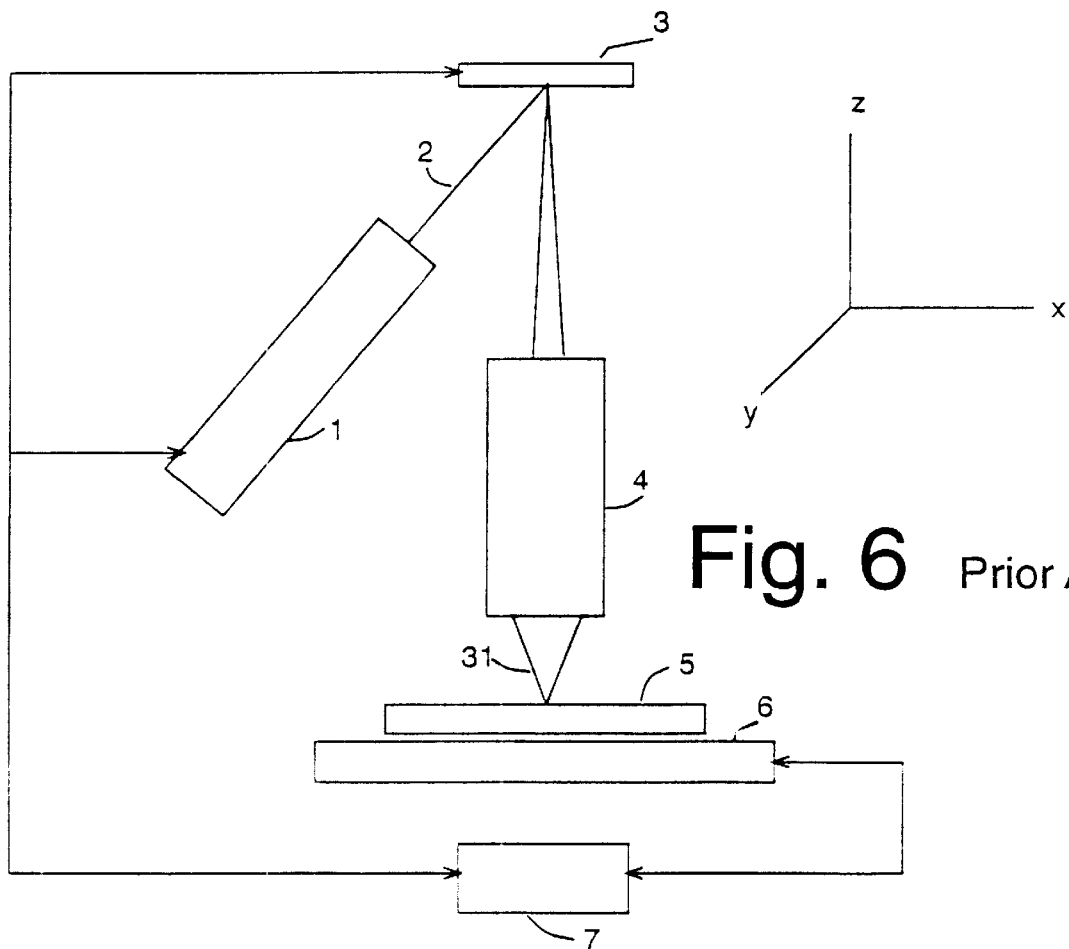
FIG. 6 is a prior art showing of a seamless scanning lithography system using a DMD, in which the 'on' illumination is collected by an optical subsystem but the 'off' illumination is rejected.
Figure 7:
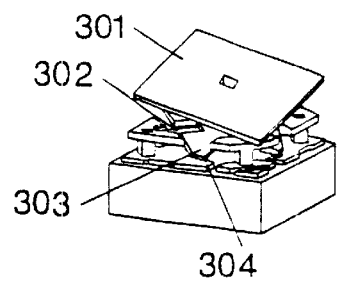
FIG. 7 is a prior art showing of a single DMD micromirror element (i.e., a DMD pixel).

As shown in FIG. 6 (prior art), the single planar stage 6 scans the single substrate 5 along the x-axis. The illumination system 1 is designed to produce a hexagonal illumination region 2 upon the DMD 3. (for reference, FIG. 7 shows an illustration of a single DMD pixel—consisting of a micromirror element 301, torsion hinge 302, yoke 303, and landing tip 4—as configured as part of a DMD array). A control system 7 is used to operate the system such that as the substrate is scanned, the image displayed by the DMD 3 is regularly updated at time intervals Δt (remaining unchanged between updates) such that it is simultaneously 'scanned' across the DMD 3 with precisely the same average velocity at which the substrate 5 is scanned along the x-axis. Because the pattern displayed by the DMD 3 remains unchanged during the time interval Δt whereas the substrate 6 continuously scans, the illumination incident upon the DMD 3 is pulsed in order to avoid image blurring on the substrate 5. After a scan, the stage 6 moves along the y-axis by an effective scan width (shown as w in FIG. 5). Now the substrate 5 and DMD 3 patterns are again scanned as before, after which the substrate 5 is again laterally moved along y, and the process is repeated until the entire substrate is exposed.

Principles of Operation

The principles of operation of the maskless system described in this disclosure are similar to those of the prior art maskless system. However, this invention incorporates a novel configuration of the illumination and imaging systems in order to image both the 'on' and 'off' reflected illuminations of the prior art DMD maskless lithography system. The primary advantage of the invention described in this disclosure compared to the prior-art DMD-based maskless lithography system is that the throughput of this invention is twice that of the prior-art DMD system. Thus, using the prior-art system, it would be necessary to operate two systems simultaneously in order to achieve the same throughput obtained with only one of the systems incorporating this invention. Considering the cost of purchasing, maintaining and operating a single lithography system, this invention represents a significant improvement over the prior art.

Method

The method provides simultaneous patterning of two large-area substrate panels with high processing throughput and high resolution. The steps are as follows:

Step a) sending a focused beam (2) from a radiation source (1);

Step b) processing the beam from the radiation source (1) to achieve self-luminosity and desired numerical aperture in an illumination system;

Step c) illuminating a DMD (3) by the radiation source (1), whereby the DMD is configured to present an 'on' pixel image and a simultaneous 'off' pixel image which is the complement of the 'on' pixel image, of a desired portion of the pattern to be placed on the substrate panels, in response to a data stream from a control system (7) which is characterized by electronic programming means to provide the data stream to said DMD (3), said 'on' pixel image and said 'off' pixel image being reflected in respective 'on' radiation and 'con' radiation along separate pathways;

Step d) imaging the 'on' radiation from the DMD (3) through a first projection subassembly onto a first substrate panel, and simultaneously imaging the 'c-on' radiation from the DMD (3) through a second projection subassembly onto a second substrate panel, on a scanning stage (6) that moves at a controlled velocity in the scan direction;

Step e) reconfiguring the DMD (3) with another set of data from the electronic programming means;

Step f) repeating steps (a) through (e) above for the next pulse from the radiation source (1), whereby the repetition rate of the radiation source (1) is synchronized by the control system (7) to the data stream that configures said DMD (3) and to the motion of the scanning stage (6), until both said first substrate panel (5) and said second substrate panel (5-c) have been scanned along the length of their respective image fields;

Step g) moving the scanning stage (6) in a direction orthogonal to the scan direction upon completion of a scan through a distance which enables seamless scanning to be achieved when an adjacent scan is generated, in the same manner as described in steps (a) through (f) above, until both the first substrate panel (5) and the second substrate panel (5-c) have been scanned seamlessly over an imaging area The method is optimized for production of identical substrate panels by using different photoresists, one positive and the other negative, one exposed to the 'on' illumination and the other exposed to the 'c-on' illumination, which results in identical patterns on each of the plural substrate panels.

Review

The primary advantage of the invention described in this disclosure compared to the prior-art DMD-based maskless lithography system is that the throughput of this invention is twice that of the prior-art DMD system. Thus, using the prior-art system, it would be necessary to operate two systems simultaneously in order to achieve the same throughput obtained with only one of the systems incorporating this invention. Considering the cost of purchasing, maintaining and operating a single lithography system, this invention represents a significant improvement over the prior art.

While the invention has been shown and described as a throughput doubler for a DMD-selected patterning system, using complementary photoresists, it will be obvious to those skilled in the art that the invention may be used for photo-ablation and for other uses and that changes in form and detail may be made without departing from the spirit and scope of the invention.

I claim:

1. A microlithographic system using a writable DMD spatial light modulator to provide the selected pattern over a number of partially overlapping scans to provide a seamless composite pattern on a photosensitive substrate, having a radiation source (1) providing a radiation beam (2) to a DMD (3) to provide via a projection subsystem (4) a dynamic partial pattern of selected 'on' pixels under control of control means (7) as a stage (6), also under control of control means (7), provides a relative motion for scanning said selected partial pattern of selected 'on' pixels onto a photosensitive layer (5) on a substrate panel (8) characterized by second projection subsystem (4-c) arranged to accept a dynamic partial pattern of selected 'c-on' pixels, which is a negative of said dynamic partial pattern of selected 'on' pixels;

a second substrate panel (8-c), having a second photosensitive layer (5-c), mounted for common scanning motion with said substrate panel (8) on said stage (6);

whereby a first pattern is imaged onto said first substrate panel (8) and a second pattern related to said first pattern is simultaneously imaged on said second substrate panel (8-c), utilizing all the radiation output of said radiation source (1).

2. A microlithographic system according to claim 1, in which said photosensitive layer (5) is complementary in polarity to said second photosensitive layer (5-c), resulting in simultaneous patterning of identical patterns on both first and second substrate panels.

3. A microlithographic system according to claim 1, in which said photosensitive layer (5) is identical in polarity to said second photosensitive layer (5-c), resulting in simultaneous patterning of a positive pattern on said first substrate panel (8) and a negative pattern on said second substrate panel (8-c).

4. A method of simultaneously patterning a plurality of large-area substrate panels with high processing throughput and high resolution, comprising the steps of:

a) sending a focused beam (2) from a radiation source (1);

b) treating the beam from said radiation source (1) for desired numerical aperture in an illumination system;

c) illuminating a DMD (3) by said radiation source (1), whereby said DMD is configured to present an 'on' pixel image and a simultaneous 'off' pixel image which is the complement of the 'on' pixel image, of a desired portion of the pattern to be placed on the substrate panels, in response to a data stream from a control system (7) which is characterized by electronic programming means to provide the data stream to said DMD (3), said 'on' pixel image and said 'off' pixel image being reflected in respective 'on' radiation and 'c-on' radiation along separate pathways;

d) imaging the 'on' radiation from said spatial light modulator (3) through a first projection subassembly onto a first substrate panel, and simultaneously imaging the 'c-on' radiation from said spatial light modulator (3) through a second projection subassembly onto a second substrate panel, on a scanning stage (6) that moves at a controlled velocity in the scan direction;

e) reconfiguring said spatial light modulator (3) with another set of data from said electronic programming means;

f) repeating steps (a) through (e) above for the next pulse from said radiation source (1), whereby the repetition rate of said radiation source (1) is synchronized by said control system (7) to the data stream that configures said DMD (3) and to the motion of the scanning stage (6), until both said first substrate panel (5) and said second substrate panel (5-c) have been scanned along the length of their respective image fields;

g) moving the scanning stage (6) in a direction orthogonal to the scan direction upon completion of a scan through a distance which enables seamless scanning to be achieved when an adjacent scan is generated, in the same manner as described in steps (a) through (f) above, until both said first substrate panel (5) and said second substrate panel (5-c) have been scanned seamlessly over an imaging area.

5. A method according to claim 4, in which said substrate panels are coated with different polarity photoresists respectively for activation by 'on' radiation and 'c-on' on radiation, which results in identical patterning of each of the plural substrate panels.

* * * * *